United States Patent [19]

Hiscock

[11] 4,177,502
[45] Dec. 4, 1979

[54] INCANDESCENT BAR DISPLAY MODULE

[75] Inventor: Benjamin E. Hiscock, S. Burlington, Vt.

[73] Assignee: Simmonds Precision Products, Inc., Tarrytown, N.Y.

[21] Appl. No.: 817,457

[22] Filed: Jul. 19, 1977

[51] Int. Cl.² .............. F21S 2/00; F21S 3/00; F21V 11/00; F21V 7/00

[52] U.S. Cl. .............. 362/218; 362/225; 362/240; 362/345; 362/346

[58] Field of Search .............. 362/236, 237, 238, 240, 362/294, 23, 27, 29, 31, 85, 225, 227, 218, 345, 346, 800, 806, 812; 40/450, 451, 452, 453

[56] References Cited

U.S. PATENT DOCUMENTS

| | | | |
|---|---|---|---|
| 1,904,132 | 4/1933 | Glatzner | 40/452 |
| 2,764,751 | 9/1956 | Gnadke | 362/85 |
| 2,843,845 | 7/1958 | Vozza | 40/452 |
| 3,500,036 | 3/1970 | Szentveri | 362/806 |
| 3,598,984 | 8/1971 | Slomski | 362/345 |
| 3,831,020 | 8/1974 | Paulson | 362/806 |

Primary Examiner—Verlin R. Pendegrass
Assistant Examiner—Donald P. Walsh
Attorney, Agent, or Firm—Edwin E. Greigg

[57] ABSTRACT

A bar-type display utilizing incandescent lamps stacked in a linear array in a metallic lamp block preferably of aluminum shaped to form a parabolic reflector configuration along its length and a tongue and groove configuration for attachment to an insulating connector block. Fins are provided on each side of the block for heat dissipation and grooves are formed transversely of the block through the parabolic reflector configuration at intervals into which barrier plates are inserted to sectionalize the block into separate reflectors for each lamp. To disperse the radiated and reflected light, a plastic diffuser is placed across the top of the reflector configuration, which may be colored to color the transmitted light, and to provide anti-reflective qualities for non-glare viewing.

The insulator connecting block is molded to the lamp block and the lamp pins are arranged so that alternate lamps may be powered by separate power supplies for redundancy purposes.

7 Claims, 5 Drawing Figures

INCANDESCENT BAR DISPLAY MODULE

BACKGROUND OF THE INVENTION

This invention relates to a bar-type display device and in particular to a bar-type display device utilizing sub-minature incandescent lamps in an unique arrangement.

Existing display systems of the vertical scale type employ moving tapes and/or pointers and suffer from poor reliability and involve high maintenance attendent with mechanical drives. Thus the useful life of such systems is somewhat diminished.

Also existing known display utilizes rear mounted incandescent lights and fiber optic light pipes to transmit the filament light to a viewing surface. Such light pipes cannot utilize the total lamp light output even though collector lenses may be used and further the light losses in fiber themselves further reduces the display intensity. Furthermore, in the prior art since most high intensity lamps are utilized their physical size requires the display to be larger than the lamps which may cause optical unevenness to the viewer when viewing the display from positions other than directly in front of the display.

It is thus an object of this invention to provide a bar-type display which serves as a solid-state indicator without any moving parts so that the useful life and readability are substantially improved.

It is a further object of the invention to provide a bar-type display in which all of the light output is utilized in a reflector design utilizing small lamps arranged in line eliminating all fiber optics so that intensity and display unevenness remain unaltered in any viewing angle.

Still another and more specific object of the invention is to utilize a metallic block preferably of extruded aluminum with a elongated curved internal recess and outside walls forming cooling fins, with the internal recess being divided by light barriers to form a bar-type modular incandescent display.

SUMMARY OF THE INVENTION

The bar display which accomplishes the foregoing object comprises a plurality of incandescent lamps stacked in a linear array in a metallic lamp block preferably of extruded aluminum shaped to form a parabolic reflector configuration along its entire length and a tongue and groove configuration for attachment to an insulating connector block. Fins are provided on each side of the block for heat dissipation and the parabolic reflector configuration is provided with barrier plates to sectionalize the block into separate reflectors for each lamp. The radiated and reflected light emanating from the display is diffused by a diffuser plate placed across the top of the reflector configuration and which may be colored to color the transmitted light and to provide anti-reflective qualities for non glare viewing. Molded to the lamp block and encapsulating the lamp connector pins and wiring is an insulating connector block. The lamp connector pins are wired so as to permit the display to be powered by separate power supplies for redundancy purposes.

DESCRIPTION OF THE PREFERRED EMBODIMENTS

Figure 1:
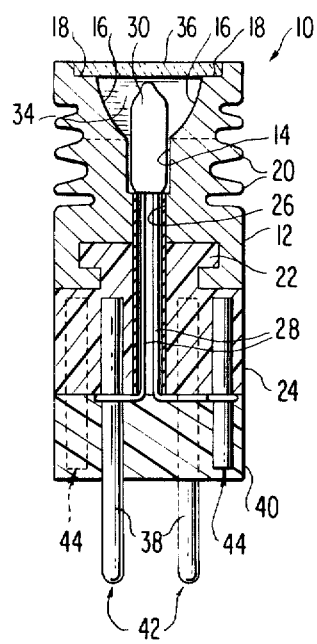
FIG. 1 is a cross-sectional view of a preferred embodiment of the display incorporating the teachings of this invention.

In the drawings the bar display is indicated in its entirety as 10 and shown to comprise an elongated lamp block 12 of extruded aluminum or other suitable material having an elongated base portion 14 running the length thereof formed substantially midway of the block which opens up into a pair of concave sidewalls 16 to form parabolic reflectors. In the preferred embodiment the base portion 14 further defines a rectangular groove 14' which extends axially the length of said lamp block 12. The sidewalls 16 terminate at the top of this block in a pair of ledges 18 which form the outer rims of the reflector. The outer sidewalls of the block are formed with a plurality of cooling fins 20 and the side of the block opposite base portion 14 is formed into a tongue and groove configuration 20 opening downwardly for receiving an insulating connector block 24.

The base portion 14 is provided with an aligned row of apertures 26, to receive the conductors 28 for a plurality of incandescent lamps 30 which seat into the base portion 14 and extend into the tongue and groove configuration 22.

Transversely of the top of the block 12, i.e., across the parabolic reflector and ledges 18, are a plurality of cuts 32 spaced across the top of the block at intervals (1/16 inch in the preferred embodiment of this invention) into which are inserted light barrier plates 34 (preferably of aluminum) which sectionalize the block into separate reflectors for each incandescent lamp 30 disposed therein. Light barrier plates are, of course, attached to each end of the block 12 to close off each end of the display. Seated in the ledges 18 is an anti-reflective color filter diffuser and segment mask 36 which masks the barrier plate 34 and serves to color the light radiating from the incandescent lights 30 and also serves as an anti-reflective filter during operation.

Figure 2:
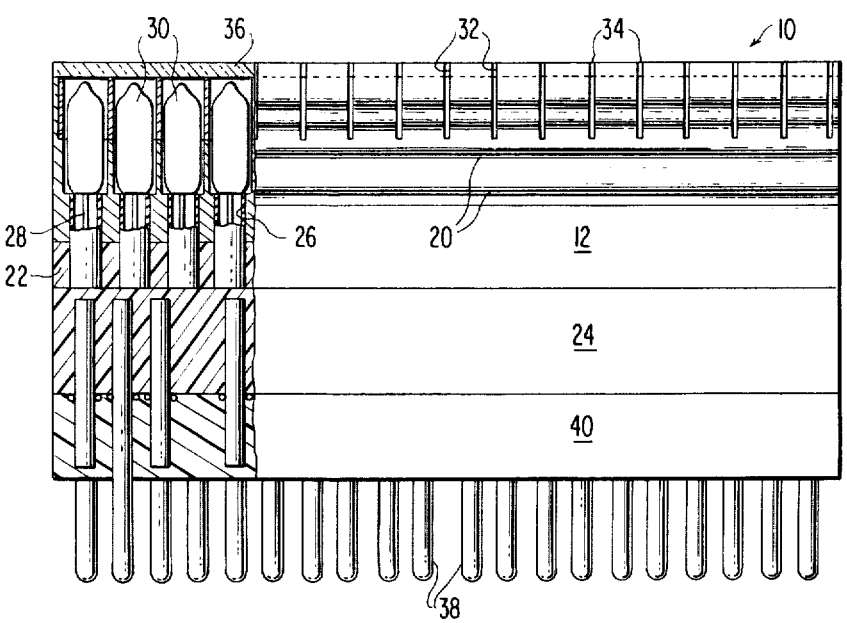
FIG. 2 is a side elevational view, partly in section, of the embodiment of FIG. 1.
Figure 4:
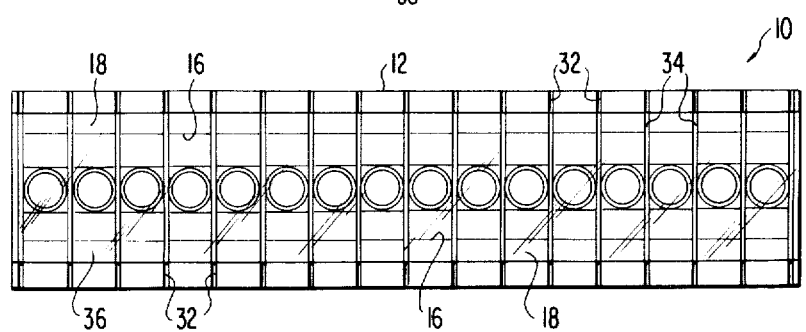
FIG. 4 is a top view of the display more clearly showing the display as a bar-type.
Figure 3:
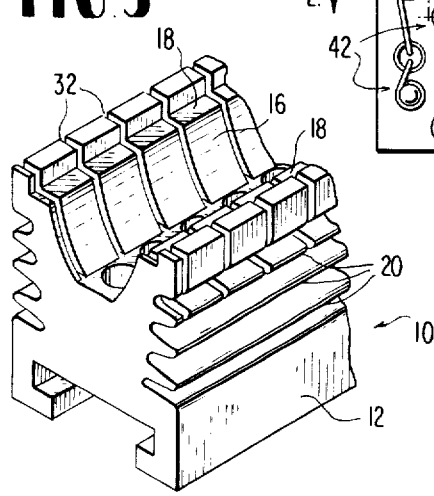
FIG. 3 is a perspective view of another embodiment of the invention showing the aluminum block forming part of the display before the lamps and connectors are incorporated therewith.

The insulating connector block 24 is made of a suitable plastic insulating material such as poly-carbonate and contains a plurality of pins 38 molded in place in the tongue and groove configuration to form an integral part of the lamp assembly 20. In the embodiments illustrated, suitable insulating tubes or sleeves are inserted in the apertures 26 and positioned to extend into the insulating connector block 24 a short distance to insulate the lamp conductors and when the conductors are connected to the pins 38, a final potting compound 40 is placed on the bottom of the connector block to encapsulate the pins and their connecting wires except for those which attach to a mating connector (not shown). The pins which extend beyond the potting compound is clearly seen in FIGS. 1, 2 and 5.

Figure 5:
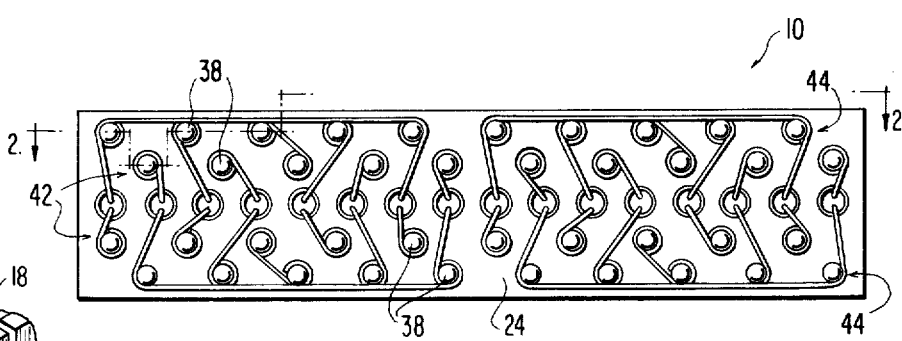
FIG. 5 is a bottom view of the display showing the manner in which the lamps of the display are connected.

Four rows of such pins are provided as clearly shown in FIG. 5. The two center rows 42 are utilized to match the mating connector, while the two outer rows 44 are used to connect one side of four lamps to a common pin. Thus, four groups of lamps of the total display of sixteen lamps, connected in this manner, are alternated which allows alternate lamps to be powered by separate power supplies providing a redundancy in the form of reduced resolution should one supply fail. This form of fail-safe redundancy is more clearly set forth in the U.S. application for patent entitled REDUNDANCY SYSTEM FOR DISPLAYS by Z. REICH and assigned to the same assignee as this invention.

What is claimed is:

1. A display comprising a plurality of lighted segments aligned to form an incandescent bar display comprising, a lamp block having a base portion provided with an aligned row of apertures, said base portion merging into concave sidewalls to form parabolic reflectors;

a plurality of incandescent lamps located in said aligned row of apertures means defining barrier plates mounted in a series of cuts arranged throughout the length of said block to sectionalize the block into separate reflectors for each lamp, cooling fins formed on outside of said lamp block to dissipate the heat generated by said incandescent lamps, an insulating connector block formed on the side of said block opposite from said parabolic reflectors; and means for connecting said lamps to a suitable source of power.

2. The incandescent bar display claimed in claim 1, further including a diffuser plate located across the parabolic reflectors to disperse the radiated and reflected light from said lamps and reflector.

3. The display as claimed in claim 2 wherein said diffuser plate is colored to color the transmitted light.

4. The display as claimed in claim 3 wherein the said connector block is made integral with said lamp block and including a plurality of pins for connecting said incandescent lamps to said source of power.

5. The display claimed in claim 4, wherein said lamp block is provided with a tongue and groove configuration which serves to connect the insulating connector block thereto.

6. The display as claimed in claim 5 wherein the pins are arranged so as to connect alternate incandescent lamps to separate power sources.

7. The display claimed in claim 1, wherein said base portion further defines a rectangular groove extending the length of said lamp block.

* * * * *